United States Patent

Iwata

[19]

[11] Patent Number: 5,847,436
[45] Date of Patent: Dec. 8, 1998

[54] BIPOLAR TRANSISTOR HAVING INTEGRATED THERMISTOR SHUNT

[75] Inventor: Hitoshi Iwata, Aichi, Japan

[73] Assignee: Kabushiki Kaisha Tokai Rika Denki Seisakusho, Aichi, Japan

[21] Appl. No.: 848,241

[22] Filed: Apr. 29, 1997

Related U.S. Application Data

[63] Continuation of Ser. No. 404,601, Mar. 15, 1995, abandoned.

[30] Foreign Application Priority Data

Mar. 18, 1994 [JP] Japan ................................. 6-048854
Mar. 18, 1994 [JP] Japan ................................. 6-048855

[51] Int. Cl.$^6$ .......................... H01L 31/08; H01L 7/00
[52] U.S. Cl. ................... 257/467; 257/539; 361/106
[58] Field of Search .......................... 257/467, 539, 257/580, 581, 582; 338/22 SD; 323/312; 361/106

[56] References Cited

U.S. PATENT DOCUMENTS

| | | | |
|---|---|---|---|
| 3,643,153 | 2/1972 | Hanson et al. | 322/33 |
| 4,205,332 | 5/1980 | Conti et al. | 257/578 |
| 4,990,987 | 2/1991 | Boucher et al. | 257/467 |
| 5,298,785 | 3/1994 | Ito et al. | 257/538 |
| 5,448,103 | 9/1995 | de Wit | 257/536 |
| 5,468,672 | 11/1995 | Rosvold | 437/60 |

*Primary Examiner*—John F. Guay
*Attorney, Agent, or Firm*—Finnegan, Henderson, Farabow, Garrett & Dunner, L.L.P.

[57] ABSTRACT

A bipolar transistor includes a chip having a base electrode and an emitter electrode on a surface thereof and a film resistor provided on a surface of the chip and electrically connecting the base electrode and the emitter electrode to each other, the film resistor having a negative resistance characteristic with temperature change.

1 Claim, 6 Drawing Sheets

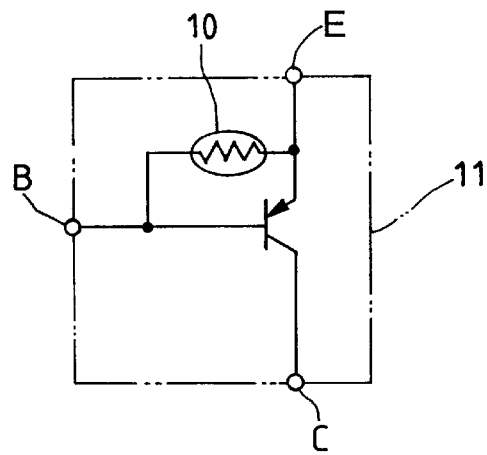
FIG. 3
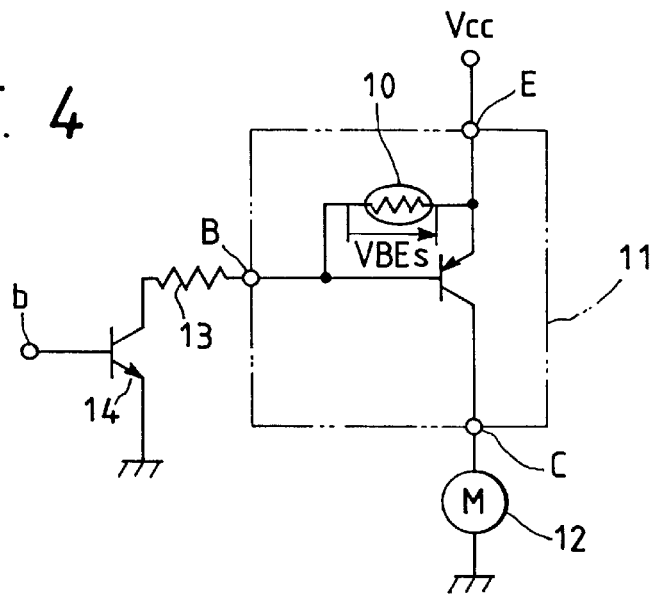
FIG. 4
FIG. 5
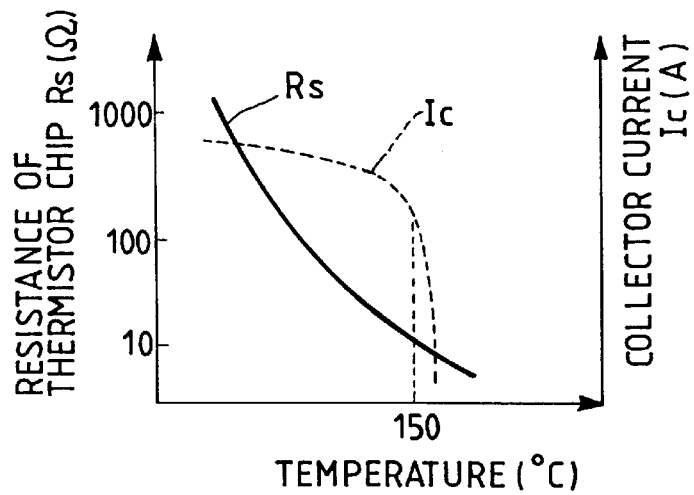

BIPOLAR TRANSISTOR HAVING INTEGRATED THERMISTOR SHUNT

This application is a continuation of application Ser. No. 08/404,601, filed Mar. 25, 1995, now abandoned.

BACKGROUND OF THE INVENTION

1. Field of the Invention

This invention relates to a bipolar transistor structured with a base electrode and an emitter electrode on an upper chip surface, that is protected from thermal destruction due to over-current and further structured with a collector electrode formed on a lower chip surface, which is mounted on a mount base in such a manner that it is electrically connected to the mount base, and more particularly to such a bipolar transistor which is protected from thermal destruction otherwise caused by over-current.

2. Related Art

A circuit including a bipolar power transistor to supply current to a load such as an electric motor suffers from the following difficulty: When over-current flows in the load for some reason, then the internal loss of the power transistor is increased, and, with inadequate heat radiation, becomes over-heated. As a result, the current increases or concentrates locally in the transistor, so that the transistor is further over-heated, and finally it may be thermally destructed. In order to overcome this difficulty, heretofore the following method has been employed: The internal temperature of the transistor is detected, and when it is higher than a rated temperature, the transistor is rendered non-conductive (off), for instance by cutting off the base current, so that it is prevented from being thermally destructed by over-current.

When, with a predetermined bias voltage VBE applied between the base and emitter of the transistor, the internal temperature of the chip becomes high, the base-emitter forward rise voltage is decreased, so that the base current is increased, and accordingly the collector current is also increased. As a result, the collector dissipation determined from the collector saturation voltage and the collector current are increased, and the transistor is increased in internal temperature, thus being thermally destructed.

In order to detect the temperature of the transistor, a temperature detecting element such as a thermistor is externally provided for the transistor, or it is provided inside the chip of the transistor, to output a temperature detection signal. In addition, a control circuit is provided which operates on the temperature detection signal. More specifically, the control circuit controls the base current according to the temperature detection signal outputted by the temperature detecting element, thereby to limit the collector current, so that the amount of heat generated in the transistor is decreased. That is, with the control circuit, the transistor is protected from thermal destruction.

In the above-described prior art method, the temperature detecting element is provided externally of the transistor. This means that the circuit is increased in the number of components. This disadvantage may be avoided by building the temperature detecting element in the transistor chip. However, even in this case, it is necessary to provide a control circuit which controls the base current according to the temperature detection signal, and therefore the resultant circuit is still increased in the number of components.

SUMMARY OF THE INVENTION

In view of the foregoing, an object of the invention is to provide a transistor protected from thermal destruction in which, without a special element or circuit, the flow of over-current is automatically limited as a function of transistor chip temperature.

The foregoing object of the invention has been achieved by provision of the following means:

According to an aspect of the present invention, a bipolar transistor is structured with a base electrode and an emitter electrode on a chip surface, wherein a film resistor, showing a negative resistance characteristic with temperature change, is provided on the surface of the chip, and electrically connects the base electrode and the emitter electrode to each other.

In the bipolar transistor, the film resistor may be provided in such a manner as to cover a part of the space between the base electrode and the emitter electrode where heat is liable to be generated.

Furthermore, in the bipolar transistor, the film resistor may be so formed as to cover the whole space between the base electrode and the emitter electrode.

According to another aspect of the invention, a transistor is structured with a collector electrode formed on a lower chip surface, which is mounted on a mount base in such a manner that the collector electrode is electrically connected to the mount base, wherein a resistor having a positive resistance characteristic with temperature change is interposed between the chip and the mount base.

In the transistor, the resistor may be in the form of a plate-shaped chip, or it may be a film resistance layer formed on the surface of the collector electrode or on the surface of the mount base.

According to the invention, when heat is generated, for instance by an increase in collector dissipation, such that the temperature of the chip is increased, the film resistor connected between the base and the emitter is decreased in resistance, so that the voltage between the base and the emitter is decreased. As a result, the base current is limited, and accordingly the collector current is automatically decreased or cut off, whereby the collector dissipation is decreased or eliminated, and the generation of heat is suppressed thereby decreasing the temperature of the chip. Thus, the invention prevents the thermal destruction of the transistor chip.

According to the invention, the film resistor covers the part of the space between the base electrode and the emitter electrode where heat is liable to be generated. Hence, the film resistor responds quickly to heat generated when the collector current increases, thereby protecting the transistor against thermal destruction.

According to the invention, the film resistor covers the whole space between the base electrode and the emitter electrode. Hence, in correspondence to the heat generated, for instance, by over-current, the base bias voltage is decreased, thereby preventing a concentration of collector current. Therefore, the generation of heat is suppressed in the whole emitter region with proper current balance; that is, the transistor is protected from thermal destruction otherwise due to concentration of current.

According to the invention, a resistor having a positive resistance characteristic with temperature change is interposed between the collector electrode on the lower surface of the chip and the mount base. Hence, when, the transistor is on and collector current flows and the collector current is increased for some reason, the collector dissipation is increased, and increased heat is generated in the transistor chip. Thus, the chip is increased in temperature.

Accordingly, the resistor, series-connected to the transistor, is increased in temperature and in resistance, thus decreasing or cutting off the collector current. With a decrease in the collector current flowing in the transistor, the generation of heat therein is suppressed. Thus, the transistor is automatically protected from thermal destruction otherwise attributed to a transistor temperature increase.

According to the invention, the resistor is like a plate-shaped chip. Hence, the transistor can be assembled as follows: The resistor is mounted on the mount base in such a manner that the former is connected to the latter, and then the transistor chip is mounted on the resistor. Therefore, in forming the transistor, it is unnecessary to specially design the transistor chip and the mount base.

According to the invention, the resistor can be a film resistance layer formed on the surface of the collector electrode or on the surface of the mount base. Hence, in assembling the transistor, it is unnecessary to additionally use conductors connected to other parts; that is, the transistor assembly work can be achieved with the use of conventional mounting procedures.

BRIEF DESCRIPTION OF THE DRAWINGS

FIG. 3 is an equivalent circuit of the transistor shown in FIGS. 1 and 2;

FIG. 4 is a circuit diagram of a motor driving circuit;

FIG. 5 is a graphical representation indicating thermistor film resistance and collector current as a function of temperature;

DETAILED DESCRIPTION OF THE PREFERRED EMBODIMENTS

According to a first embodiment of the invention, a PNP type transistor will be described with reference to FIGS. 1 through 5.

Figure 1:
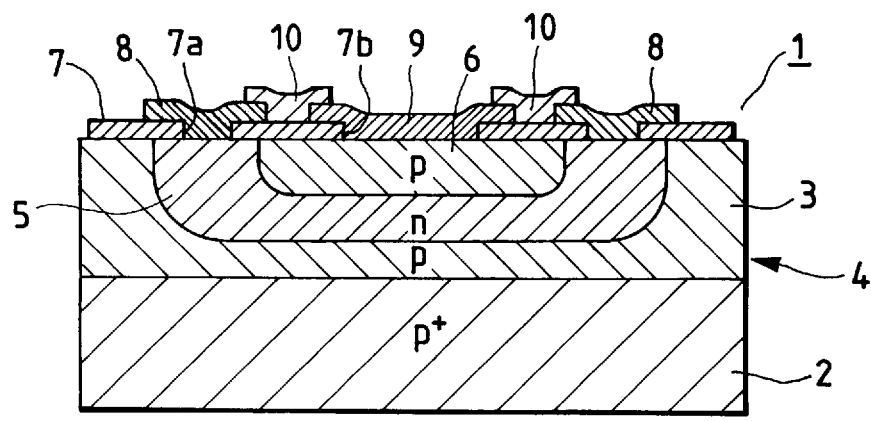
FIG. 1 is a sectional view outlining the arrangement of an NPN type transistor, which constitutes a first embodiment of the invention.

FIG. 1 is a sectional diagram outlining the structure of the transistor. A transistor chip 1 is formed as follows: A low-density p-type epitaxial layer 3 is formed on a high-density p-type silicon substrate 2 to provide a collector region 4. In the p-type epitaxial layer 3, a base region 5 is formed by n-type impurity diffusion. In the base region 5, an emitter region 6 is formed by high-density p-type impurity diffusion.

An insulating film 7, such as a silicon oxide film, is formed on the upper surfaces of the base region 5 and the emitter region 6. The insulating film 7 has windows 7a and 7b to partially expose the base region 5 and the emitter region 6, respectively. An aluminum base electrode 8 and an aluminum emitter electrode 9, are formed in the windows 7a and 7b, respectively. In addition, a thermistor film 10 is formed between the base electrode 8 and the emitter electrode 9 to electrically connect the electrodes 8 and 9 to each other. The thermistor film 10 serves as a film resistor, and is characterized with a negative resistance characteristic with temperature change.

Figure 2:
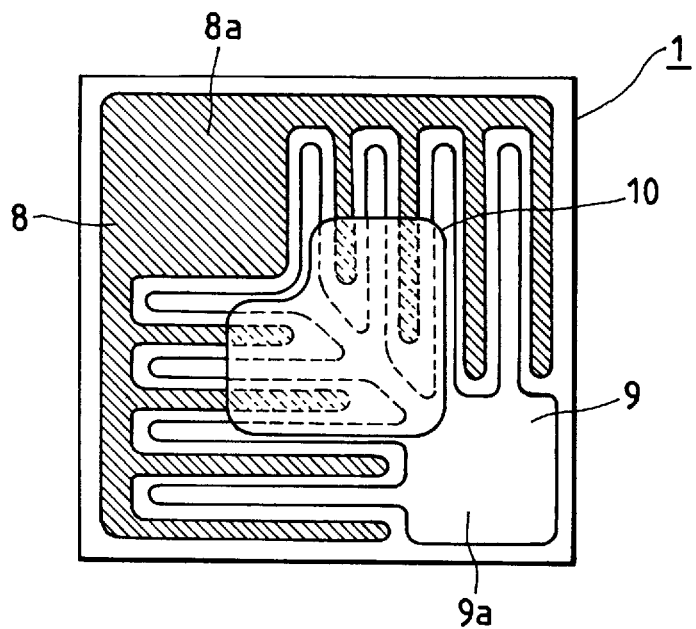
FIG. 2 is a top view of the transistor shown in FIG. 1.

FIG. 2 is a top view of the above-described transistor chip 1. The emitter region 6 is extended like the teeth of a comb in the base region 5 which is substantially rectangular, and accordingly the base electrode 8 and the emitter electrode 9 are also extended like the teeth of a comb, being intertwined with each other. The base electrode 8 and the emitter electrode 9 have bonding pads 8a and 9a, respectively. The thermistor film covers the central portion of the zigzag space between the base electrode 8 and the emitter electrode 9.

The transistor chip 1 is set in a package (not shown), to form a PNP type transistor 11. The collector region 4 of the chip 1 is connected through an electrode (not shown) to a collector terminal C with a bonding wire, and similarly the base electrode 8 and the emitter electrode 9 are electrically connected to a base terminal B and an emitter terminal E with bonding wires, respectively. FIG. 3 is an equivalent circuit of the PNP type transistor 11 thus formed. As shown in FIG. 3, the thermistor film 10, which is adapted to detect temperature, is connected between the base terminal B and the emitter terminal E of the PNP type transistor 11.

FIG. 4 is an electrical circuit of a drive circuit including the above-described transistor 11 which is provided for a load, namely, a DC motor 12. The emitter terminal E of the transistor 11 is connected to a DC power source terminal VCC, and the collector terminal C is grounded through the DC motor 12, and the base terminal B is grounded through an input resistor 13 and the collector and emitter electrodes of a driving NPN type transistor 14.

The operation of the first embodiment will be further described with reference to the FIGs.

First, the fundamental operation of the thermistor film 10 of the transistor 11 will be described. The characteristic of resistance Rs of the thermistor film 10 which changes with temperature is, for instance, as indicated by the solid line in FIG. 5. The resistance Rs is considerably high when the temperature of the thermistor film is around room temperature; however, as the temperature increases, it is abruptly decreased to a value of two figures.

In the transistor 11, the thermistor film 10 is connected between the emitter terminal E and the base terminal B, and its resistance is considerably high when its temperature is an ordinary operating temperature. Hence, when a predetermined base bias voltage VEB is applied across the base terminal B and the emitter terminal E, a base current flows to render the transistor conductive (on), so that a collector current flows in the transistor. When the collector current increases in the transistor 11, the junction temperature is increased, and the forward rise voltage of the emitter-base junction is decreased, as a result of which the base current is increased, and accordingly the collector current is further increased.

When the temperature of the transistor is increased in the above-described manner, the resistance Rs of the thermistor film 10 connected between the base and emitter is abruptly decreased, and accordingly the base-emitter bias voltage VBE is decreased. When the bias voltage becomes lower than the emitter-base forward rise voltage VEE at that temperature, the base current is abruptly decreased, and therefore the collector current IC is also abruptly decreased, and finally cut off. In other words, as the chip 1 generates heat, the transistor 11 is automatically rendered non-conductive (off), and the collector current IC is cut off. Hence, the generation of heat due to the over-current is suppressed, and the transistor is protected against thermal destruction.

In the drive circuit of the DC motor 12 shown in FIG. 4, an "H" level drive signal applied to the base terminal b renders the driving transistor 14 conductive (on), so that the collector potential is set to "L" level. As a result, a bias voltage VBE, which is obtained by subjecting the DC supply voltage VCC to voltage division with the resistor 13, is applied across the base and emitter of the transistor 11. If, the chip temperature of the transistor 11 is low, the resistance Rs of the thermistor film 10 is considerably high, and the bias voltage VBE becomes higher than the emitter-base forward rise voltage, namely, an on-state voltage VBEon, so that the transistor 11 is rendered conductive. As a result, the DC supply voltage VCC is applied through the transistor 11 to drive the DC motor 12.

When the current supplied to the DC motor 12 is increased for some reason, the collector loss of the transistor 11 is increased, so that the chip 1 is increased in temperature. Accordingly, the thermistor film 10 is also increased in temperature, and, because of the above-described negative resistance characteristic, its resistance Rs is decreased. When the terminal voltage VBEs across the thermistor film 10 becomes lower than the bias voltage VBEon (VBEs<VBEon), the transistor 11 is rendered non-conductive (off) since a bias voltage value equal at least to VBEon is required to render the transistor 11 conductive.

The terminal voltage VBEs across the thermistor film 10 is defined by the following equation:

$$V\ BEs = VCC \times (Rs/(Rs+Ri))$$

where Ri is the resistance of the input resistor 13. The thickness and width of the thermistor film 10, which determine the film resistance Rs and thus should be so selected that, when the temperature of the transistor chip 1 becomes a predetermined value (for instance 150° C.), the transistor 11 is rendered non-conductive (off); that is, the terminal voltage VBEs of the thermistor film 10 is less than the on-state voltage VBEon.

In the first embodiment described above, the thermistor film 10 is formed on the surface of the transistor chip 1 to electrically connect the base electrode 8 and the emitter electrode 9 to each other. Hence, when the current flowing in the transistor 11 increases to generate increased heat therein, the heat thus generated acts to decrease the resistance of the thermistor film 10 thereby to decrease the transistor base current. This automatically prevents the thermal destruction of transistor which otherwise may be caused by the heat generated by over-current.

In the first embodiment, the thermistor film 10 is provided at the part of the transistor where current is liable to concentrate. Hence, the temperature rise of the transistor chip 1 due to the generation of heat is quickly detected, which protects the transistor against thermal destruction.

Second Embodiment

Figure 6:
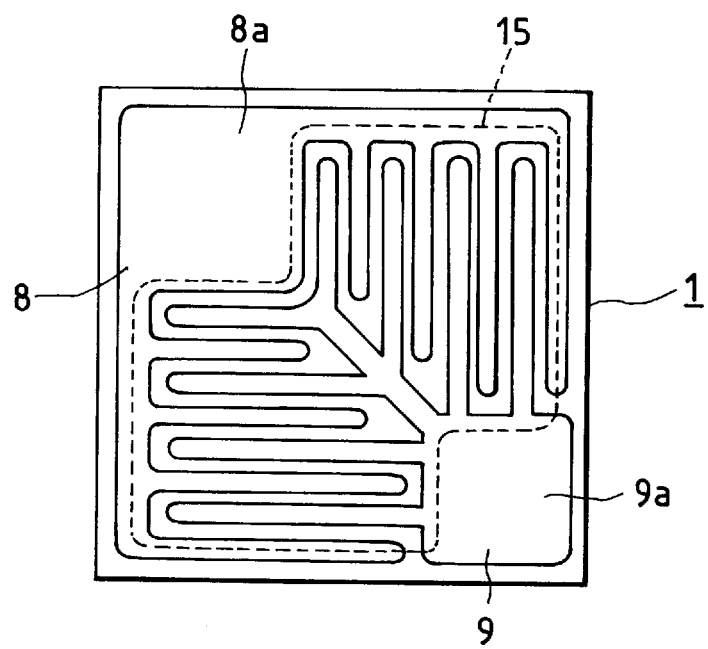
FIG. 6 is a top view showing a second embodiment of the invention, corresponding to FIG. 2.
Figure 7:
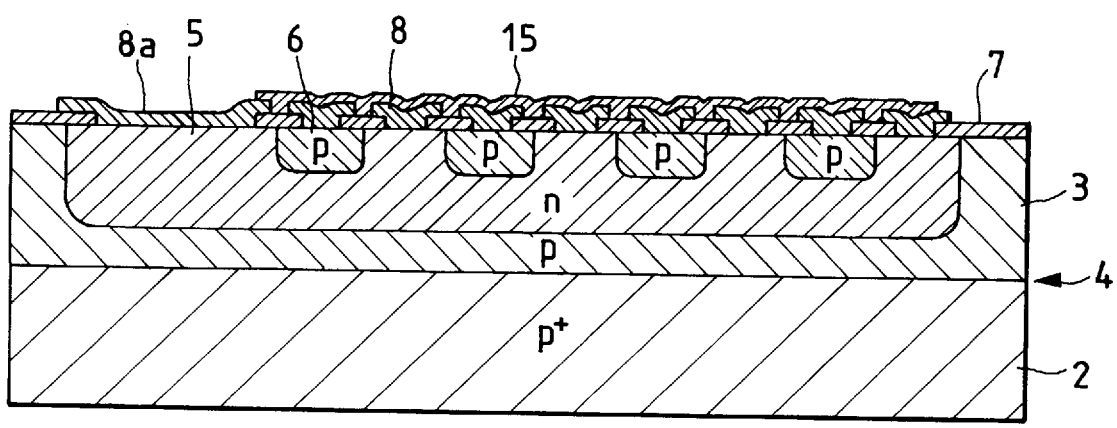
FIG. 7 is a sectional view outlining the arrangement of the second embodiment of the invention.

FIGS. 6 and 7 show a second embodiment of the invention. The second embodiment is different from the first embodiment in that a film resistor, namely, a thermistor film 15, fully covers the zigzag space between the base electrode 8 and the emitter electrode 9. As shown in FIG. 6, the thermistor film 15 is formed to cover the whole space between the base electrode 8 and the emitter electrode 9. The thermistor film 15 is formed, for instance, by vacuum deposition as shown in FIG. 7, an explanatory sectional diagram.

When collector current flows in the transistor in a manner similar to that described for the first embodiment and the collector current concentrates locally in the emitter region 6 to generate heat there, the heat thus generated decreases the resistance of the corresponding part of the thermistor film 15, so that the collector current is decreased or cut off. Thus, even in the case where the collector current is not uniform in distribution, the local heat generation is suppressed in correspondence to the concentration of the collector current in the emitter region 6, so that the flow of current in the transistor is well-balanced. This prevents thermal destruction of the transistor which otherwise may be caused by non-uniform flow of current in it.

While the preferred embodiments of the invention have been described, it should be noted that the invention is not limited thereto or thereby. That is, they may be modified or changed as follows:

The technical concept of the invention may be applied to an NPN type transistor, and to a transistor having no epitaxial layer.

The thermistor film formed as a film resistor on the surface of the transistor may be divided into several parts.

Third Embodiment

The technical concept of the invention is applied to an NPN transistor in a third embodiment of the invention which, will be described with reference to FIGS. 8 through 12.

Figure 8:
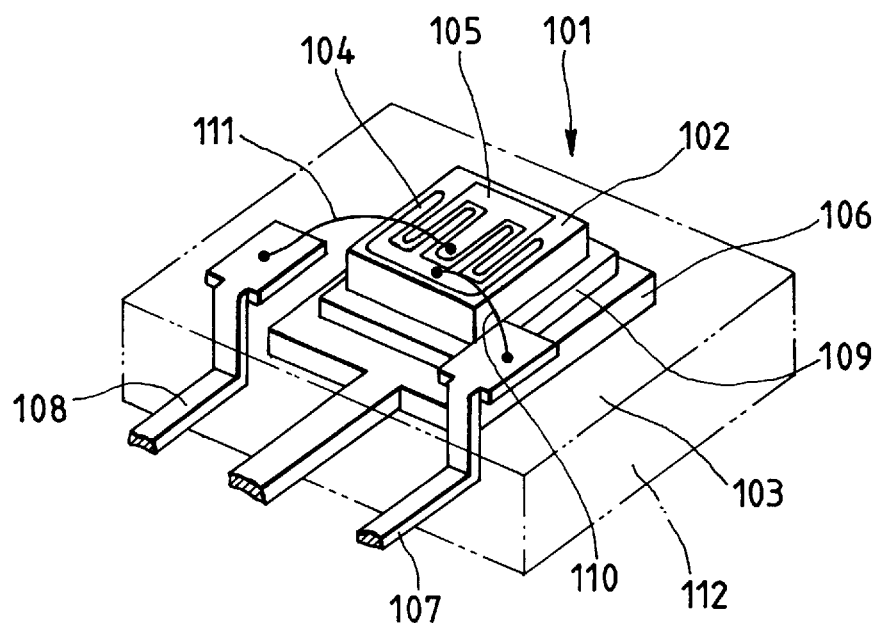
FIG. 8 is a perspective view showing essential components of a third embodiment of the invention.
Figure 9:
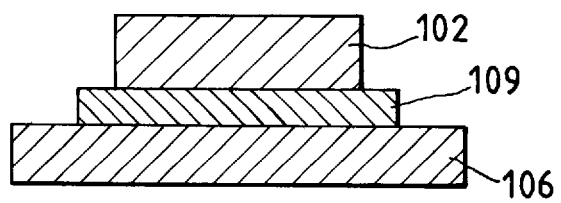
FIG. 9 is a vertical sectional view of a transistor chip in the third embodiment.

FIG. 8 shows an external appearance of a power transistor 101 comprising a transistor chip 102 and a mount base 103. The transistor chip 102 is made from silicon, and it is formed by forming an N-type base region and a P-type emitter region in a P-type silicon substrate, for instance, by impurity diffusion. The P-type silicon substrate is employed as a collector region. A base electrode 104 and an emitter electrode 105 are formed on the upper surface of the transistor chip, in such a manner that they are electrically connected to the base region and the emitter region, respectively. A collector electrode (not shown) is formed on the lower surface of the transistor chip 102, which is electrically connected to the collector region.

The mount base 103 is made of copper, and has a collector lead 106, a base lead 107, and an emitter lead 108 which are isolated from one another. A resistor having a positive resistance characteristic with temperature change, namely, a plate-shaped thermistor chip 109, is electrically connected to the upper surface of the collector lead 106 with electrically conductive bonding material such as solder. The thermistor chip 109 is a so-called "PTC thermistor" which has a positive temperature resistance characteristic according to which resistance is increased as temperature increases.

The above-described transistor chip 102 is mounted through the thermistor chip 109 on the collector lead 106 in such a manner that it is electrically connected to the latter, for instance, by soldering. The base lead 107 is electrically connected through a bonding wire to the base electrode 104 formed in the transistor chip 102. Similarly, the emitter lead 108 is electrically connected through a bonding wire 111 to the emitter electrode 105 formed in the transistor chip 102. The transistor 101 is set in a package 112, with the leads 106 through 108 and the transistor chip 102 sealed with insulating resin or the like.

Figure 10:
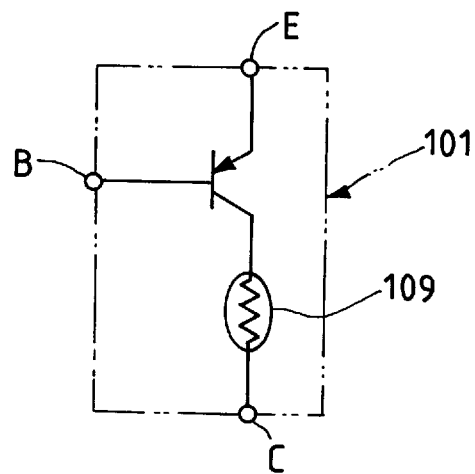
FIG. 10 is an equivalent circuit of a transistor according to the third embodiment.

FIG. 10 is an equivalent circuit of the transistor 101. The base electrode 104 of the latter 101 is connected to a base terminal B, the emitter electrode 105 is connected to an emitter terminal E, and the collector electrode is connected through the thermistor chip 9 to a collector terminal C.

The operation of the above-described embodiment will be described with reference to FIGS. 11 and 12.

Figure 11:
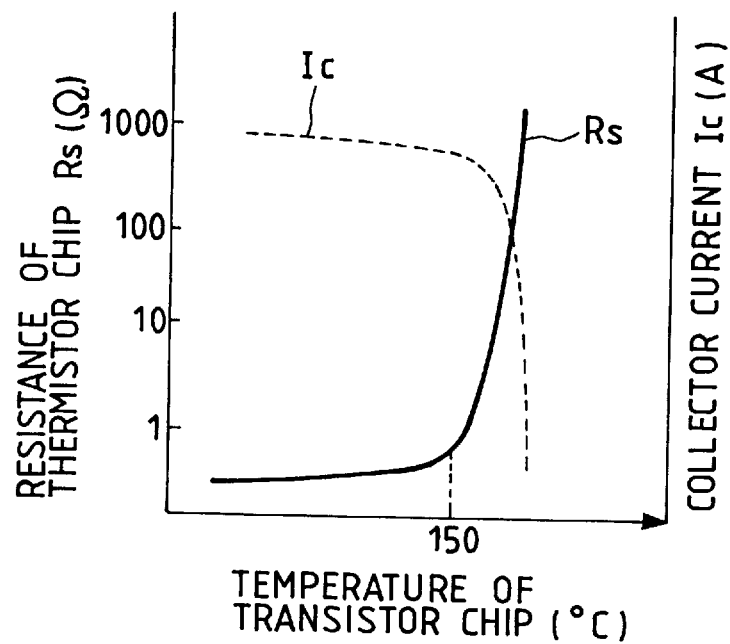
FIG. 11 is a characteristic diagram indicating resistance and collector current as a function of temperature in the third embodiment.
Figure 12:
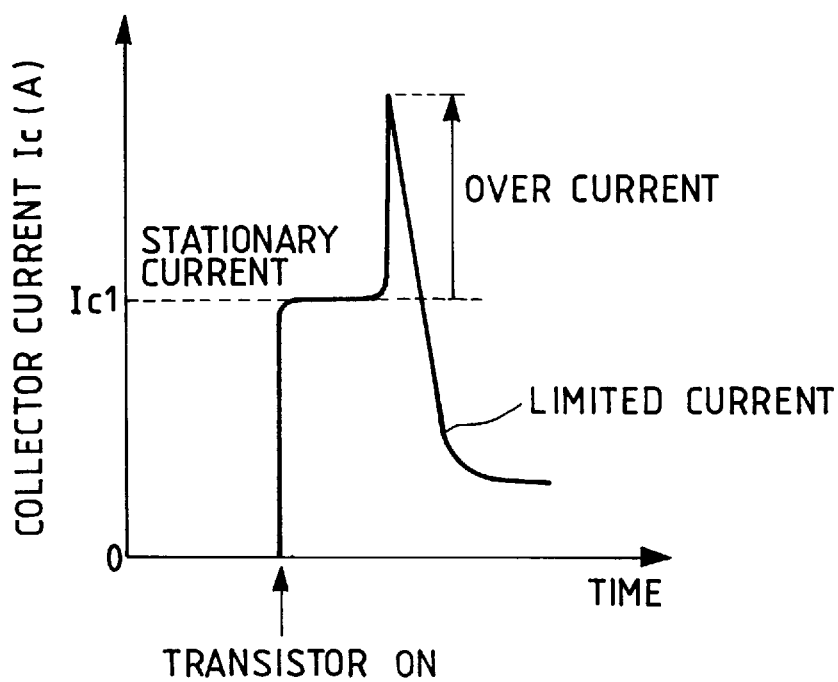
FIG. 12 is a graphical representation indicating collector current as a function of time in the third embodiment.

The resistance Rs of the thermistor chip 109 has a positive temperature characteristic with temperature change as indicated by the solid line in FIG. 11. That is, when the temperature of the thermistor chip 109 is lower than 150° C., the resistance Rs is very low (lower than 1Ω), being substantially zero; and, when it exceeds 150° C., it is abruptly increased to the order of kΩ.

When, in the equivalent circuit of FIG. 10, the collector current IC of the transistor 101 increases, the collector dissipation is increased, and the amount of heat generated therein is increased. When the temperature of the transistor chip 102 exceeds about 150° C., the resistance Rs of the thermistor chip 9 is abruptly increased. Thus, the collector current IC flowing in the transistor chip 102 is greatly limited by the thermistor chip 109 connected in series with the collector electrode. That is, as indicated by the broken line in FIG. 11, the collector current IC is abruptly decreased when the temperature of the transistor chip exceeds about 150° C., and, finally, it is cut off.

When the collector current IC is abruptly decreased as described above, the collector dissipation of transistor chip 102 is also decreased, and the amount of heat generated therein is decreased. Hence, the temperature rise of the transistor chip 102 is suppressed. That is, the thermal destruction of the transistor is automatically prevented.

It is assumed that a drive circuit is formed in which the transistor 101 is connected in series to a load such as an electric motor, and it is turned on and off to control the operation of the load. If, with the transistor 101 rendered conductive (on), a large collector current IC flows for some reason, and heat is generated in the transistor chip 102, then, as indicated in FIG. 11, the resistance Rs of the thermistor chip is increased with an increasing temperature of the transistor chip, to automatically limit the collector current IC.

In the third embodiment, the thermistor chip 109 having the positive temperature characteristic is connected between the collector electrode and the collector lead 106. Hence, when the current flowing in the transistor 101 is increased, and the transistor chip 102 is increased in temperature, the resistance of the thermistor chip is increased by the heat generated in the transistor chip, to limit the collector current IC and, thereby, to decrease the temperature of the transistor chip 102. Thus, the third embodiment also provides transistor protection against thermal destruction by heat generated by excessive collector current IC. In addition, it is simple in arrangement and low in manufacturing cost, using no temperature sensor or control circuit.

Furthermore, in the third embodiment, the transistor chip 102 is not a specially designed chip, and the collector lead 106 on the mount base 103 is not a specially designed lead; that is, a temperature protected transistor is provided with facilitated manufacture.

Fourth Embodiment

Figure 13:
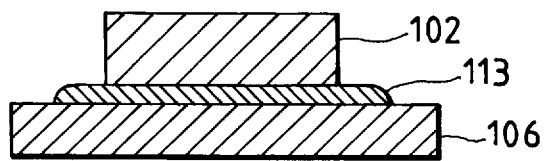
FIG. 13 is a vertical sectional view showing the arrangement of a fourth embodiment of the invention.

FIG. 13 shows a fourth embodiment of the invention. The fourth embodiment is different from the above-described second embodiment in that, instead of the thermistor chip 109, a film resistor, namely, a thermistor film layer 113, is employed. The layer 113 is formed on the surface of the collector lead 106, for instance, by vacuum deposition, and it is equal in electrical characteristic to the thermistor chip 109 in the second embodiment.

Hence, the fourth embodiment has the same effects or merits as the second embodiment. In the fourth embodiment, the thermistor film layer 113 is formed on the collector lead 106 of the mount base 10 in advance. Hence, the transistor chip 102 can be mounted on the collector lead 106 according to the conventional method. That is, the manufacture can be achieved with ease.

It should be noted that transistor invention is not limited to the fourth embodiment as described above. Various changes and modifications may be made therein without departing from the invention including the following: the thermistor film layer 113 may be formed directly on the collector electrode on the lower surface of the transistor chip 102; the technical concept of the invention may be applied to an NPN type transistor; the package may be made of a material other than resin; in addition, the technical concept of the invention may be applied to transistors other than bipolar transistors.

As is apparent from the above description, the transistor of the invention has the following outstanding effects or merits:

According to the invention, the base electrode and the emitter electrode are electrically connected to each other through the film resistor which has a negative resistance characteristic with temperature change. Hence, when heat is generated in the transistor, for instance, increase in collector dissipation, the temperature of the chip is increased, the film resistor is decreased in resistance, and the voltage between the base and the emitter is decreased. As a result, the base current is limited, and the collector current is decreased or cut off. Thus, the transistor is protected against thermal destruction, which might otherwise be attributed to the generation of heat, without use of a temperature detecting element or control circuit.

According to the invention, the film resistor is provided in the part where heat is liable to be generated. Hence, the film resistor responds quickly to heat which is generated when the collector current increases, thereby protecting the transistor from the thermal destruction.

The film resistor may be so formed as to cover the whole space between the base electrode and the emitter electrode. Hence, in correspondence to the part where heat is generated, for instance, by over-current, the base bias voltage is decreased, thereby preventing a concentration of collector current. Therefore, the generation of heat is suppressed in the whole emitter region with proper balance, thereby protecting the transistor against thermal destruction otherwise caused by concentration of collector current.

According to the invention, a resistor having a positive resistance characteristic with temperature change, is interposed between the collector electrode on the lower surface of the chip and the mount base. Hence, when, the transistor is conductive and the collector current is increased and the transistor chip is increased in temperature, the resistor series-connected to the transistor is increased in temperature and accordingly in resistance, thus decreasing or cutting off the collector current. That is, the collector current flowing in the transistor is limited, and the transistor chip is decreased in temperature. Thus, without use of a temperature detecting element or control circuit, collector over-current is automatically detected, so that the transistor is protected from thermal destruction.

According to the invention, the resistor is like a plate-shaped chip. Hence, the transistor can be assembled as follows: the resistor is mounted on the mount base in such a manner that the former is connected to the latter, and the transistor chip is then mounted on the resistor. Therefore, in forming the transistor, it is unnecessary to use a special design for the transistor chip and the mount base.

According to the invention, a resistor is the film resistance layer formed on the surface of the collector electrode or on the surface of the mount base. Hence, in assembling the transistor, it is unnecessary to use other additional parts; that is, the transistor assembly work can be achieved with use of a conventional mounting procedure.

What is claimed is:

1. A bipolar transistor comprising:

a chip having a base electrode and an emitter electrode on a surface thereof; and a thermistor film provided on a surface of said chip, and electrically connecting said base electrode and said emitter electrode to each other, wherein said thermistor film is provided in such a manner as to cover the whole space between said base electrode and said emitter electrode, and said thermistor film having a thickness and width to provide a predetermined negative resistance characteristic so that when heat generated from said chip reaches a predetermined temperature, the predetermined resistance of said thermistor film is abruptly decreased, automatically rendering the bipolar transistor non-conductive and protecting the bipolar transistor from thermal destruction.

* * * * *